(12) United States Patent
Takeda et al.

(10) Patent No.: US 9,005,747 B2
(45) Date of Patent: Apr. 14, 2015

(54) TRANSPARENT ELECTRODE AND ORGANIC ELECTRONIC ELEMENT USING SAME

(75) Inventors: Akihiko Takeda, Sagamihara (JP); Hirokazu Koyama, Hino (JP)

(73) Assignee: Konica Minolta Holdings, Inc. (JP)

( * ) Notice: Subject to any disclaimer, the term of this patent is extended or adjusted under 35 U.S.C. 154(b) by 195 days.

(21) Appl. No.: 13/636,248

(22) PCT Filed: Mar. 25, 2011

(86) PCT No.: PCT/JP2011/057317
§ 371 (c)(1),
(2), (4) Date: Sep. 20, 2012

(87) PCT Pub. No.: WO2011/125537
PCT Pub. Date: Oct. 13, 2011

(65) Prior Publication Data
US 2013/0014980 A1    Jan. 17, 2013

(30) Foreign Application Priority Data
Apr. 5, 2010 (JP) .................... 2010-086726

(51) Int. Cl.
| | | |
|---|---|---|
| *B32B 15/04* | (2006.01) | |
| *B32B 5/16* | (2006.01) | |
| *H05K 1/00* | (2006.01) | |
| *H05K 1/09* | (2006.01) | |
| *H01L 51/52* | (2006.01) | |
| *H01L 51/00* | (2006.01) | |

(52) U.S. Cl.
CPC ........ *H01L 51/5215* (2013.01); *H01L 51/5212* (2013.01); *H01L 51/0022* (2013.01); *H01L 51/0085* (2013.01); *Y02E 10/549* (2013.01)

(58) Field of Classification Search
None
See application file for complete search history.

(56) References Cited

U.S. PATENT DOCUMENTS

2007/0074316 A1 *  3/2007  Alden et al. .................. 977/762

FOREIGN PATENT DOCUMENTS

| JP | 2004-504693 A | 2/2004 |
|---|---|---|
| JP | 2006-89554 A | 4/2006 |
| JP | 2006-93123 A | 4/2006 |
| JP | 2009-59666 A | 3/2009 |
| WO | 97/34447 A1 | 9/1997 |
| WO | 00/67531 A1 | 11/2000 |
| WO | 02/06898 A2 | 1/2002 |

OTHER PUBLICATIONS

International Search Report for International application No. PCT/JP2011/057317 mailing date of Jun. 28, 2011 with English translation.

Office Action issued by the Japanese Patent Office in connection with patent application No. JP 2012-509433, dated Jun. 9, 2014, with english translation.

* cited by examiner

*Primary Examiner* — Sheeba Ahmed
(74) *Attorney, Agent, or Firm* — Cantor Colburn LLP

(57) ABSTRACT

Disclosed is a transparent electrode which is configured of a first conductive layer that is composed of a metal or metal oxide fine wire that is formed in a pattern on a substrate; and a second conductive layer that covers the first conductive layer and contains a conductive polymer. The transparent electrode is characterized in that the fine wire of the first conductive layer satisfies the conditions mentioned below. Also disclosed is an organic electronic element. Line width (W): 20-200 μm Height (H): 0.2-2.0 μm Aspect ratio: $0.001 < H/W \leq 0.1$ Coefficient of cross-sectional shape: $0.6 < S/(W \cdot H) < 0.9$ (In this connection, S represents the cross-sectional area of the conductive layer.)

9 Claims, 2 Drawing Sheets

CROSS-SECTIONAL SHAPE COEFFICIENT    1.0    0.9    0.8    0.7    0.6    0.5

4a          4b

TRANSPARENT ELECTRODE AND ORGANIC ELECTRONIC ELEMENT USING SAME

CROSS REFERENCE TO RELATED APPLICATIONS

This is a U.S. national stage of application No. PCT/JP2011/057317, filed on 25 Mar. 2011. Priority under 35 U.S.C. §119(a) and 35 U.S.C. §365(b) is claimed from Japanese Application No. 2010-086726, filed 5 Apr. 2010, the disclosure of which are also incorporated herein by reference.

TECHNICAL HELD

The present invention relates to an organic electronic element such as an organic electroluminescence element (hereafter, it is called as an organic EL element) or an organic solar cell. In particular, the present invention relates to an organic electronic element having achieved improved element properties of driving voltage; efficiency; and lifetime.

BACKGROUND

In recent years, it has been focused attention on an organic electronic element such as an organic EL element or an organic solar cell. In these elements, a transparent electrode has became one of indispensable composing technologies.

Conventionally, as a transparent electrode, there has been mainly used an ITO transparent electrode having an indium-tin complex oxide (ITO) membrane produced by a vacuum deposition method or a sputtering process on transparent substrates, such as glass and a transparent plastic film. However, there were problems that a manufacturing cost was high since the metal oxide transparent conductive film manufactured using a vacuum processes, such as a vacuum deposition method and a sputtering process, was inferior with respect to manufacturing efficiency, and that it was inapplicable to the device application required to have a flexible nature since it was inferior with respect to flexibility.

Against this problem, it was proposed a method of forming a transparent conductive material layer by coating or printing using a coating liquid which is prepared by dissolving or dispersing a conductive polymer represented by π-conjugated polymer into a suitable solvent (for example, refer to Patent document 1). However, compared with a metal oxide transparent electrode prepared by a vacuum forming-film method, such as ITO, there was a problem that transparency and conductivity were decreased remarkably. Further, when an organic electronic device such as an organic EL element was formed using this, there was observed a behavior that the interface resistance with the functional layer prepared on this transparent conductive material layer was high (for example, increase of driving voltage for an organic EL element), in addition to low conductivity of a transparent electric conductive material layer itself. Namely, there was a problem of decreasing the performance as an element.

On the other hand, there was proposed a transparent conductive film produced by laminating a metal fine wire pattern and a conductive polymer (for example, refer to Patent document 2). However, when an organic EL element is formed using such a transparent conductive film, covering of the metal fine wire with the conductive was insufficient, and there was produced a current leak seemingly originated from the edge portion of the metal fine wire. This resulted in a problem of decreasing the performance of an element.

Regarding to the shape of these metal fine wires, several proposals were made in the filed of electromagnetic wave shield (for example, refer to Patent documents 3 and 4). However, these methods produced a shape having a high aspect ratio in the metal fine wire portion, and the height of the metal fine wire portion itself was very high. An organic electronic element targeted in the present application is produced by laminating many thin functional layers having a thickness of 1 μm or less on a transparent electrode. During the production, if the cross-sectional shape of the metal fine wire is a cone shape, or if the height of the metal fine wire is too high, film formation of the functional layers become difficult, and this will cause a large thickness distribution. This will cause decrease of element performance, and will produce the current leak as described above depending on the case, and it becomes difficult to form an element. Moreover, although it was disclosed a technology in which the electromagnetic wave shield pattern made of metal fine wires was covered with another solid conductive layer, it was not indicated about the covering state of the metal fine wire shape and a solid layer made of a conductive layer. Therefore, it is impossible to apply the metal fine wire pattern known in the filed of an electromagnetic wave shield to the transparent electrode used for an organic electronic element.

PRIOR ART DOCUMENTS

Patent Documents

Patent document 1: Japan Patent Application Publication (JP-A) No. 6-273964
Patent document 2: JP-A No. 2009-87843
Patent document 3: JP-A No. 10-75087
Patent document 4: JP-A No. 2009-88070

SUMMARY OF THE INVENTION

Problems to be Solved by the Invention

The present invention was made in view of the above-mentioned situation. An object of the present invention is provide an electrode having high conductivity and transparency, and further to provide an organic electronic element excellent in efficiency by controlling a current leak or an electric filed amplification to decrease driving voltage for an organic electronic element such as an organic EL element or an organic solar cell.

Means to Solve the Problems

As described above, it was found a problem in the known technology which uses a transparent electrode composed of metal fine wires and a conductive polymer with respect to formation of a functional layer of an organic electronic element. The present inventors found that formation of a functional layer of an organic electronic element was improved to result in achieving an improved element property by the following technology. That is, this technology uses a transparent electrode which contains: a first conductive layer composed of a metal or a metal oxide fine wire which is formed in a pattern on a substrate; and a second conductive layer which covers the first conductive layer and contains a conductive polymer. The fine wire in the first conductive layer satisfies the conditions mentioned below, Line width (W): 20 to 200 μm; Height (H): 0.2 to 2.0 μm; Aspect ratio: $0.001 < H/W \leq 0.1$; and Coefficient of cross-sectional shape: $0.6 < S/(W \cdot H) < 0.9$ (S represents a cross-sectional area of the conductive layer).

In the present invention, it becomes improved the formation of the second conductive layer which is composed of a conductive polymer laminated on the first conductive layer by making the fine wire of the first conductive layer composed of a metal or a metal oxide fine wire into a specific shape. Further, it is formed satisfactory the functional layer which is formed on the second conductive layer without producing a local thickness distribution.

An object of the present invention as described above can be achieved by the following constitution.

1. A transparent electrode comprising: a first conductive layer composed of a metal or a metal oxide fine wire which is formed in a pattern on a substrate; and a second conductive layer which covers the first conductive layer and contains a conductive polymer, wherein the fine wire in the first conductive layer satisfies the following conditions.

Line width (W): 20 to 200 μm;

Height (H): 0.2 to 2.0 μm;

Aspect ratio: $0.001 < H/W \leq 0.1$; and

Cross-sectional shape coefficient: $0.6 < S/(W \cdot H) < 0.9$, provided that "S" represents a cross-sectional area of the conductive layer.

2. The transparent electrode described in the aforesaid item 1, wherein a height of the pattern of the first conductive layer is 0.5 to 1.5 μm.

3. The transparent electrode described in the aforesaid items 1 or 2, wherein the first conductive layer is composed of silver particles 4. The transparent electrode described in any one of the aforesaid items 1 to 3, wherein the second conductive layer contains the following Polymer (A).

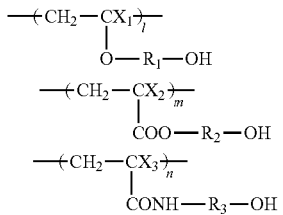

Polymer (A)

In the formula, $X_1$ to $X_3$ each independently represent a hydrogen atom or a methyl group, and $R_1$ to $R_3$ each independently represent an alkylene group having carbon atoms of 5 or less. "1", "m" and "n" each represent a composition ratio (in mol %), and $50 \leq 1+m+n \leq 100$.

5. An organic electronic element having the transparent electrode described in any one of the aforesaid items 1 to 4.

6. The organic electronic element described in the aforesaid item 5 being used for an organic electroluminescence element or an organic solar cell.

Effects of the Invention

According to the present invention, it is possible to provide an electrode having high conductivity and transparency, and further to provide an organic electronic element excellent in efficiency by controlling a current leak or an electric filed amplification to decrease driving voltage for an organic electronic element such as an organic EL element or an organic solar cell.

EMBODIMENTS TO CARRY OUT THE INVENTION

Figure 1:
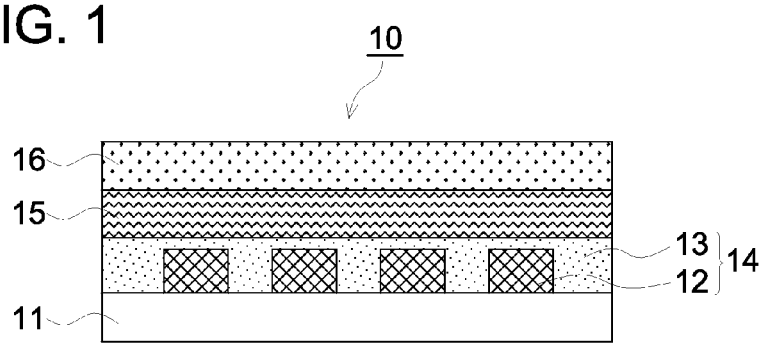
FIG. 1 is a cross-sectional view showing a structure of an organic electronic element of the present invention.

Hereafter, although the best embodiment to carry out the present invention will be explained in detail, the present invention is not limited to these.

<Substrate>

In the present invention, a plastic film, a plastic plate and glass can be used as a transparent substrate. It is preferable to use a transparent plastic film from the viewpoints of lightness and flexibility.

Examples of a raw material for a plastic film and a plastic plate include: a polyester such as polyethylene terephthalate (PET) and polyethylene naphthalate (PEN); a polyolefin such as polyethylene (PE), polypropylene (PP), polystyrene, and EVA; a vinyl resin such as polyvinylchloride and polyvinylidene chloride; polyether ether ketone (PEEK), polysulfone (PSF), polyethersulfone (PES), polycarbonate (PC), polyamide, polyimide, an acrylic resin film and triacetyl cellulose (TAC).

With respect to a transparent electrode and an organic electronic element of the present invention, it is preferable that the substrate is excellent in a surface smoothness. The surface smoothness is preferably as follows: an arithmetic mean roughness Ra is 5 nm or less; and a maximum height Rz is 50 nm or less. More preferably, Ra is 2 nm or less; and Rz is 30 nm or less. Still more preferably, Ra is 1 nm or less; and Rz is 20 nm or less. The surface of the substrate may be provided with a sublayer of a heat curable resin, an electron beam curable resin or a radiation curable resin to give smoothness. It may be given smoothness with a mechanical process such as grinding. Here, the surface smoothness can be determined from the measurement using an atomic force microscope (AFM) according to a surface roughness standard (JIS B 0601-2001).

In order to secure the wettability and adhesion property of a coating solution, surface treatment can be performed and an adhesion assisting layer may be provided on the transparent substrate used for the present invention. A well-known technique can be used conventionally with respect to surface treatment or an adhesion assisting layer. Examples of surface treatment include: surface activating treatment such as: corona discharge treatment, flame treatment, ultraviolet treatment, high-frequency wave treatment, glow discharge process, active plasma treatment and laser treatment. Examples of materials for an adhesion assisting layer include: polyester, polyamide, polyurethane, vinyl copolymer, butadiene copolymer, acrylic copolymer, vinylidene copolymer and epoxy copolymer. Although a single layer may be sufficient as the adhesion assisting, it may be the composition of two or more layers in order to raise adhesion property.

Moreover, it is preferable to prepare a gas barrier layer in order to intercept oxygen and moisture in the atmosphere.

As a formation material of a gas barrier layer, it can use metal oxides and metal nitrides such as: silicon oxide, silicon nitride, silicon oxide nitride, aluminium nitride, and aluminum oxide. These materials also have an oxygen barrier function besides a water vapor bather function. Especially it is preferable to use silicon nitride and silicon oxide nitride since they have an excellent barrier nature, solvent resistance, and transparency. Further, a barrier layer can also be made as a multilayered composition if needed. As a formation method of a gas barrier layer, it can use a resistance heating vapor deposition method, an electron beam vapor deposition method, a reactive vapor deposition method, an ion plating method, or a sputtering method according to requirement. Although the thickness of each inorganic layer which constitutes the above-mentioned gas barrier layer is not limited in particular, typically, it is preferably in the range of 5 nm to 500 mm per layer, and more preferably in the range of 10 nm to 200 nm per layer. A gas barrier layer is preferably prepared at least on one surface of a substrate, and more preferably it is prepared on both surfaces.

<Conductive Layer>

A conductive layer of the present invention is composed of a first conductive layer made of a metal or a metal oxide fine wire pattern (it is called as "a fine wire" or "a fine wire pattern"); and a second conductive layer made of a conductive polymer.

Although the material to form a first conductive layer is a metal or a metal oxide, it is preferable to use a metal from the viewpoint of conductivity. Examples thereof include: gold, silver, copper nickel and chromium. An alloy of these metals can be used. It may be a single layer or multiple layers. Although the shape of a fine wire pattern is not limited in particular, a stripe shape or a mesh shape can be cited. The shape can be decided from the viewpoint of conductivity and transparency.

A forming method of a conductive layer is as follows. First, a first conductive layer is formed on a support in a fine wire pattern made of a metal or a metal oxide. The thin line pattern can be formed by coating a dispersion liquid containing metal or metal oxide particles and a binder, and then by drying to form a film, followed by performing pattering the formed film by etching, for example. In addition, it may be formed by coating a silver halide dispersion and then by drying a film, followed by exposure and development to performing pattering the formed film. The film forming method is not limited in particular as long as it is a liquid phase film forming method. There can be employed coating methods such as: a roller coating method, a bar coating method, a dip coating method, a spin coating method, a casting method, a die coating method, a blade coating method, a bar coating method, a gravure coating method, a curtain coating method, a spray coating method, and a doctor coating method and an ink-jet coating method. Further, it can be formed using a dispersion liquid of nanoparticles of metal or metal oxide with a spray coating method, an ink-jet coating method, a gravure coating method or a flexo printing method, or it can be directly formed in a pattern via a mask.

Further, a second conductive layer is formed by coating a dispersion liquid made of a conductive polymer in such a manner to cover a first conductive layer which has been formed in a pattern, followed by drying. The coating of the second conductive layer can be made with a liquid phase film forming method as described above.

The second conductive layer may further contain a non-conductive polymer which contains a hydroxyl group and exhibits a conductivity enhancing effect of the conductive polymer. Thereby, high conductivity, high transparency, water resistance, and smoothness can be achieved simultaneously.

By forming the conductive layer of the present invention which has a laminated structure as described above, a high conductivity, which cannot be acquired with a single use of a metal or a metal oxide fine wire, or a conductive polymer layer, can be uniformly acquired in an electrode surface.

The transparent electrode of the present invention may be further provided with a third conductive layer arranged directly adjacent to and under the first conductive layer, or arranged in an interlayer adjacent to the first and the second conductive layers. The third conductive layer is preferably a metal nanoparticle layer, and especially, a silver nanowire layer is preferable. By incorporation of the third conductive layer, the above-mentioned conductivity in an electrode surface can be made high and uniform.

The surface of the support is preferably subjected a smoothness treatment with a hard coat layer, for example. A surface smoothness (unevenness) of a first support is preferably as follows: an arithmetic mean roughness Ra is 5 nm or less; and a maximum height Rz is 50 nm or less. More preferably: Ra is 1 nm or less; and Rz is 30 nm or less.

Here, Ra and Rz indicate a surface smoothness. They indicate respectively the following meanings: Ra=arithmetic mean roughness; and Rz=maximum height (the vertical interval between the summit part and a bottom part in the surface); and. They are specified based on JIS B601 (2001). In the present invention, a commercially available atomic force microscope (AFM) can be used for measurement of Ra and Rz. For example, they can be measured by the following ways.

As an AFM, SPI3800N probe station and SPA400 multi-functional-capability type module made by Seiko Instruments Co., Ltd., are used. The sample cut off in a square having a side of about 1 cm is set on a level sample stand on a piezo scanner, then, a cantilever is allowed to approach to a surface of the sample. When the cantilever reaches the region where an atomic force can function, the cantilever is scanned in the XY direction, and irregularity of the surface of the sample is caught by displacement of the piezo element in the Z direction. A piezo scanner which can scan the XY direction of 150 µm and the Z direction of 5 µm is used for the measurement. A cantilever used is silicon cantilever SI-DF20 made by Seiko Instruments Co., Ltd., and measurement is done in a DFM mode (Dynamic Force Mode) using the resonant frequency of 120-150 kHz, the spring constant of 12-20 N/m. The portion of 80×80 µm is measured with the scanning frequency of 0.1 Hz.

Figure 3:
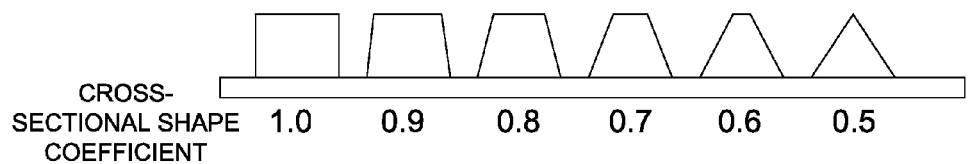
FIG. 3 is a drawing which shows a cross-sectional shape of and a cross-sectional shape coefficient of a metal or a metal oxide fine wire of the present invention.
Figure 4:
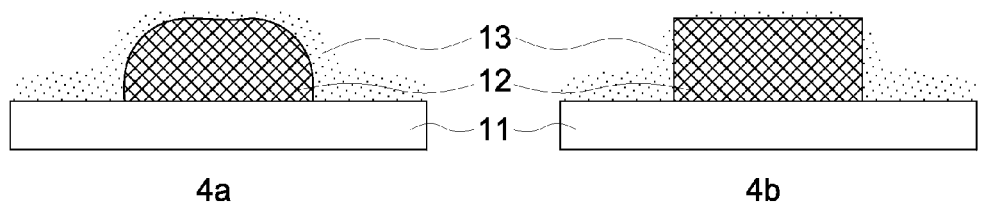
FIG. 4 is a cross-sectional view of a first electrode of the present invention.

FIG. 3 shows an example of a cross-sectional shape of a metal or a metal oxide fine wire (hereafter, it is also called as "a fine wire") and a cross-sectional shape coefficient of the present invention. FIG. 4 shows an example of a cross-sectional shape of a first electrode composed of a first conductive layer and a second conductive layer.

Although a line width of the fine wires in the first conductive layer is 20 to 200 µm, preferably, it is 40 to 120 µm, and more preferably, it is 40 to 80 µm. When the line width of the fine wires is 20 µm or less, a required conductivity will not be obtained, and when the line width is 200 µm or more, transparency will de decreased. Although a height of the fine wires is 0.2 to 2.0 µm, preferably, it is 0.5 to 1.5 µm, and more preferably, it is 0.7 to 1.2 µm. When the height of the fine wires is 0.2 µm or less, a required conductivity will not be obtained, and when the height is 2 µm or more, it will produce electric current leak or deterioration of layer thickness distribution of a functional layer. Further, an aspect ratio (H/W) of the fine wires is 0.001 to 0.1, preferably, it is 0.01 to 0.03. When the aspect ratio of the fine wires is 0.001 or less, conductivity will be decreased, and when it is 0.1 or more, it will become a factor to produce deterioration of performance in the production of an organic electronic element. Further, when a cross-sectional area of the fine wires in the vertical direction to the substrate is defied as "S", the cross-sectional shape coefficient represented by "S/(W·H)" is 0.6 to 0.9. Preferably, it is 0.7 to 0.8. When the cross-sectional shape coefficient is 0.6 or less, the cross-sectional shape of the fine wire will become almost a drill shape, and when it is 0.9 or more, the cross-sectional shape will become almost a rectangle. Both shapes will produce electric current leak to result in failure of element production.

Figure 2:
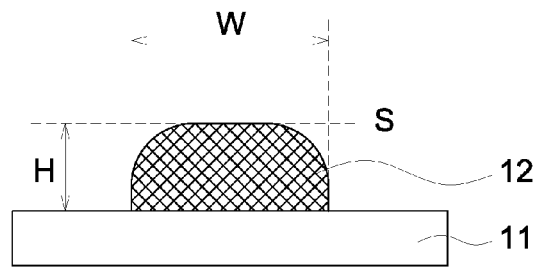
FIG. 2 is a drawing which shows a cross-section of a metal or a metal oxide fine wire of the present invention.

In FIG. 2, there is shown a concept of W, H and S for calculating a cross-sectional shape coefficient. In FIG. 3, there are shown cross-sectional shape coefficients depending difference in shape.

Although the production of the fine wire or the fine wire patter of the present invention which has such cross-sectional shape can be chosen from the various coating methods as mentioned above, a direct patterning such as gravure or flexography is preferable from the viewpoint of productivity and control of a fine wire shape. The fine wire shape can be adjusted by a dispersion liquid concentration of metal nanoparticles or metal oxide nanoparticles and a dispersion liquid viscosity to be used, and by changing a cross-sectional shape of a plate according to it.

After forming the first conductive layer, a drying treatment and a heat treatment can be given suitably. Although there is no restriction in particular as conditions for a drying treatment, it is desirable to carry out a drying treatment within a temperature range in which neither a base material nor a conductive layer is deteriorated. For example, a drying treatment can be made at 80° C. to 150° C. for 10 seconds to 10 minutes. In the present invention, the conductivity of the first conductive layer can be improved remarkably by further performing a heat treatment after completion of the drying treatment, thereby the performance of the element can be improved. Furthermore, scratch-proof property, water resistance, and adhesiveness with a base material of the first conductive layer with a base material can be improved. The heat treatment is preferably done at the temperature of 50° C. or more for more than 5 minutes. The conductive improvement effect becomes small at the temperature of less than 50° C. Moreover, even if the temperature is 150° C. or more, the heat treatment may be performed within the range in which neither a base material nor a conductive layer is deteriorated, for example, for 0.001 second to several seconds. Although the heat treatment may be performed on-line or off-line after forming a first conductive layer, it is preferable to be performed immediately after coating and drying from the viewpoint of improvement of conductivity.

The transparent electrode of the present invention is composed of a first conductive layer having a high conductivity and a second conductive layer having a low conductivity and high transparency compared with the first conductive layer. The surface specific resistance of the fine wire portion in the first conductive layer is preferably 100Ω/☐ or less. More preferably, it is 10Ω/☐ or less, and still more preferably, it is 5Ω/☐ or less.

The surface specific resistance of the second conductive layer is preferably $10^5$Ω/☐ or less. More preferably, it is $10^4$Ω/☐ or less, and still more preferably, it is $1 10^3$Ω/☐ or less.

Surface specific resistance can be measured based on JIS K6911 or ASTM D257, for example, and it can be measured easily using a commercially available surface resistivity meter.

Regarding the ratio of a conductive polymer to a non-conductive polymer containing a hydroxyl group in the second conductive layer, it is preferable that the amount of a non-conductive polymer containing a hydroxyl group is 30 mass parts to 900 mass parts when a conductive polymer is set to be 100 mass parts. The amount of a non-conductive polymer containing a hydroxyl group is more preferably 100 mass parts or more from the viewpoints of prevention of electric current leak, the conductivity enhancing effect of a non-conductive polymer containing a hydroxyl group and the transparency.

The dry film thickness of the second conductive layer is preferably 30 nm to 2,000 nm. From the viewpoint of conductivity, preferably, it is 100 nm or more. And from the viewpoint of surface smoothness of an electrode, more preferably, it is 200 nm or more. Moreover, from the viewpoint of transparency, it is preferably 1,000 nm or less.

After forming the second conductive layer, a drying treatment and a heat treatment can be given suitably. Although there is no restriction in particular as conditions for a drying treatment, it is desirable to carry out a drying treatment within a temperature range in which neither a base material nor a conductive layer is deteriorated. For example, a drying treatment can be made at 80° C. to 150° C. for 10 seconds to 10 minutes. In the present invention, it can accelerate and complete the cross-linking reaction of the non-conductive polymer containing a hydroxyl group by further performing a heat treatment after completion of the drying treatment. By this treatment, washing resistance and solvent resistance of electrode will be improved remarkably, and performance of an element will be further improved. In particular, in an organic EL device, it can be acquired the effects such as decrease of driving voltage and improvement of lifetime.

The heat treatment is preferably carried out at a temperature of 50° C. to 200° C. for 30 minutes or more. At a temperature of less than 50° C., a reaction accelerating effect will be small, and when it exceeds 200° C., the effect becomes small probably because thermal damage of the materials is increased. The treatment temperature is more preferably 80° C. to 150° C., and the treatment time is more preferably 1 hour or more. Although there is no upper limit to the treatment time in particular, it is preferably 24 hours or less from the viewpoint of productivity. The heat treatment may be performed on-line or off-line after coating a conductive layer followed by drying. When it is performed off-line, carrying it out under a reduced pressure will lead to acceleration of drying moisture, and it is desirable.

In the present invention, an acid catalyst can be used to accelerate and complete a cross-linking reaction of a non-conductive polymer containing a hydroxyl group. Hydrochloric acid, sulfuric acid, or ammonium sulfate can be used as an acid catalyst. Moreover, with respect to a polyanion used for a conductive polymer as a dopant, a sulfo group containing polyanion can be used for both purpose of a dopant and a catalyst. Moreover, together with the use of an acid catalyst, the above-mentioned heat treatment can be performed, and it leads also to shortening of processing time, and it is desirable.

Furthermore, a dispersion liquid incorporated with a conductive polymer and a non-conductive polymer containing a hydroxyl group of the present invention may contain other transparent non-conductive polymers and additives in an amount to an extent which satisfies simultaneously conductivity, transparency, and smoothness of a conductive layer.

It can be used by choosing from a wide variety of natural polymer resins or synthetic polymer resins as a transparent non-conductive polymer, and a water-soluble polymer or an aqueous polymer emulsion is especially preferable. Examples of usable water-soluble polymers are: natural polymers such as starch, gelatin and agar; semi-synthetic polymer cellulose derivatives such as hydroxypropyl methyl cellulose, carboxymethyl cellulose and hydroxyethyl cellulose; synthetic polymers such as polyvinyl alcohol, polyacrylic acid polymer, poly acrylic amide, polyethylene oxide, polyvinyl pyrrolidone. Examples of usable aqueous polymer emulsions are: acrylics resins (for example, acrylic silicon modified resin, fluorine modified acrylic resin, urethane modified acrylic resin, epoxy modified acrylic resin), polyester resin, urethane resin and vinyl acetate resin.

Examples of usable synthetic polymer resins are: transparent thermoplastic resins (for example, polyvinyl chloride, vinyl chloride-vinyl acetate copolymer, polymethyl methacrylate, nitro cellulose, chlorinated polyethylene, chlorinated polypropylene and vinylidene fluoride); and transparent curable resins hardened with heat, light, electron beam, and radiation (for example, melamine acrylate, urethane acrylate, epoxy resin, polyimide resin, and silicone resin such as acrylic modified silicate).

Examples of an additive include: a plasticizer, a stabilizer such as an antioxidant and an anti-sulfuration agent, a surface-active agent, a dissolution accelerator, a polymerization inhibition agent, and a colorant such as a dye and a pigment. Furthermore, from the viewpoint of improving workability, such as coating property, it may include a solvent (for example, such as: water, an organic solvent such as alcohol, glycol, cellosolve, ketone, ester, ether, amide, and hydrocarbon).

[Metal Nanoparticles]

As a metal or a metal oxide used for the conductive layer of the present invention, it is preferable a metal nanoparticle or a metal oxide nanoparticle. Especially preferable is a metal nanoparticle. A metal nanoparticle or a metal oxide nanoparticle (hereafter it is called as a metal nanoparticle) indicates a metal or a metal oxide in a minute particle having a particle diameter of an atomic scale to a nm size. An average particle diameter of metal nanoparticles is preferably 10 to 300 nm, and more preferably, it is 30 to 200 nm. A metal used for a metal nanoparticle of the present invention is preferably silver or copper from the viewpoint of conductivity. It may be used silver or copper independently, or it may be an alloy of silver and copper. Further, silver, or copper may be plated with other metal.

The metal nanoparticle of the present invention may be a grain shape, a rod shape, or a wire shape as long as the minor axis of the diameter of a particle is a nm size. A fine wire in the first conductive layer is preferably to be a grain shape from the viewpoint of conductivity and the smoothness of the fine wire, while a fine wire in the third conductive layer is preferably to be a metal nanowire having a wire shape from the viewpoint of conductivity and transparency.

Generally, metal nanowires indicate a linear structure composed of a metallic element as a main structural element. In particular, the metal nanowires in the present invention indicate a linear structure having a diameter of from an atomic scale to a nanometer (nm) size.

In order to form a long conductive path by one metal nanowire, a metal nanowire applied to the conductive fibers concerning the present invention is preferably have an average length of 3 μm or more, more preferably it is 3 to 500 μm, and still more it is 3 to 300 μm. In addition, the relative standard deviation of the length of the conductive fibers is preferably 40% or less. Moreover, a smaller average diameter is preferable from the viewpoint of transparency, on the other hand, a larger average diameter is preferable from a conductive viewpoint. In the present invention, 10 to 300 nm is preferable as an average diameter of metal nanowires, and it is more preferable to be 30 to 200 nm. Further, the relative standard deviation of the diameter is preferably to be 20% or less. The metal nanowires in the conductive layer are preferably contacted with each other, and further, it is preferable that they are contacted in a mesh form. The conductive layer having the metal nanowires contacted with each other or contacted in a mesh form can be easily prepared by using the above-described liquid film forming method. The coating weight of the metal nanowires is preferably 0.005 $g/m^2$ to 0.5 $g/m^2$, and more preferably, it is 0.01 $g/m^2$ to 0.2 $g/m^2$.

In the present invention, there is no restriction in particular to the production means of metal nanowires. It is possible to prepare metal nanowires via various methods such as a liquid phase method or a gas phase method. For example, the manufacturing method of Ag nanowires may be referred to Adv. Mater. 2002, 14, 833-837 and Chem. Mater. 2002, 14, 4736-4745; and the manufacturing method of Cu nanowires may be referred to JP-A No. 2002-266007. As for a preparation method of Ag nanowires, it is possible to simply prepare a large amount of Ag nanowires in an aqueous system and the electrical conductivity of silver is highest of all metals.

<Conductive Polymer>

A conductive polymer of the present invention is a polymer made of a z conjugated conductive polymer and a polyanion (a poly anion). This conductive polymer can be easily produced by chemically oxidized polymerization of a later described precursor monomer which forms a π conjugated conductive polymer by a suitable oxidizing agent and an oxidation catalyst under the existence of a later described polyanion.

(Π Conjugated Conductive Polymer)

The π conjugated conductive polymer used in the present invention is not particularly limited. It can be used the following chain conductive polymers: polythiophene (including the basic polythiophene, it is the same as that of the following), polypyrrole, polyindole, polycarbazole, polyaniline, polyacethylene, polyfuran, polyparaphenylene vinylene, polyazulene, polyparaphenylene, polyparaphenylene sulfide, polyisothianaphthene and polythiazyl. Among them, polythiophene and polyaniline are preferable from the viewpoints of conductivity, transparency and stability. Polyethylene dioxythiophene is most preferable.

(Π conjugated conductive polymer precursor monomer)

A precursor monomer is a compound having a π conjugated system in the molecule and forms also a π conjugated system in the main chain of a polymer when it is polymerized by action of a suitable oxidizing agent.

Specific examples of a precursor monomer include:
pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodohiophene, 3-cyanothiophene, 3-phenylthiophene, 3,4-dimethylthiophene, 3,4-dibutylthiophene, 3-hydroxythiophene, 3-methoxyhiophene, 3-ethoxyhiophene, 3-butoxythiophene, 3-hexyloxythiophene, 3-heptyloxythiophene, 3-octyloxythiophene, 3-decyloxythiophene, 3-dodecyoxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxylthiophene, 3-methyl-4-ethoxylthiophene, 3-carboxylthiophene, 3-methyl-4-carboxylthiophene, 3-methyl-4-carboxyethylthiophene, 3-methyl-4-carboxybuthylthiophene, aniline, 2-methylaniline, 3-isobutylaniline, 2-aniline sulfonic acid, and 3-aniline sulfonic acid (Polyanion)

Examples of a polyanion include: a substituted or unsubstituted polyalkylene, polyalkenylene, polyimide, polyamide, polyester and copolymer thereof. A polyanion is composed of a composing unit having an anionic group and a composing unit without having an anionic group.

This polyanion is a solubilizing polymer which makes a n conjugated conductive polymer to solubilize in a solvent. Moreover, the anionic group of the polyanion functions as dopant to the π conjugated conductive polymer, and improves the conductivity and heat resistance of the π conjugated conductive polymer.

The anionic group of a polyanion should just be a functional group which enables chemical oxidation dope to the π conjugated conductive polymer. Especially, from the viewpoints of ease of production and stability, a mono substituted sulfate group, a mono substituted phosphate group, a phosphate group, a carboxyl group and a sulfo group, are preferable. Furthermore, a sulfo group, a mono substituted sulfate group and a carboxyl group are more preferable from the viewpoint of the doping effect to the π conjugated conductive polymer of a functional group. Especially, a sulfo group is preferable.

Specific examples of an polyanion include: polyvinyl sulfonic acid, polystyrene sulfonic acid, polyallyl sulfonic acid, ethyl polyacrylate sulfonic acid, butyl polyacrylate sulfonic acid, poly-2-acrylamide-2-methylpropane sulfonic acid, polyisoprene sulfonic acid, polyvinyl carboxylic acid, polystyrene carboxylic acid, polyallyl carboxylic acid, polyacryl carboxylic acid, polymethacryl carboxylic acid, poly-2-acrylamide-2-methylpropane carboxylic acid, polyisoprene carboxylic acid and polyacrylic acid. These may be a homopolymer, or they may be a copolymer of two or more sorts. It may be a polyanion containing a fluorine atom in the molecule. Specific examples are cited as: Nafion™ which contains perfluoro sulfonic acid (made by DuPont Co., Ltd.) and Flemion™ composed of perfluoro vinyl ether containing a carboxylic acid (made by Asahi Glass Co., Ltd.). Among them, a compound containing a sulfonic acid is preferable, since when heat-treatment is performed for 5 minutes or more at a temperature of 100° C. to 200° C. after forming the layer by applying and drying a conductive polymer containing layer using a compound which has a sulfonic acid, the cleaning resistance and solvent resistance of this coated layer will be improved remarkably. Further, polystyrene sulfonate, polyisoprene sulfonic acid, ethyl polyacrylate sulfonic acid, and butyl polyacrylate sulfonic acid are preferable among them.

These poly anions have high compatibility with an aqueous binder, and conductivity of the obtained conductive polymer can be made higher.

The degree of polymerization of a polyanion is preferably in the range of 10 to 100,000 monomer units, and it is more preferably in the range of 50 to 10,000 monomer units from the viewpoint of solvent solubility and conductivity.

As a production method of a polyanion, the following methods can be cited, for example: a method in which an anion group is directly introduced in a polymer which does not have an anion group using an acid; a method in which sulfonation is carried out to a polymer which does not have an anion group using a sulfonation agent; and a method in which polymerization is carried out using a polymerizable monomer containing an anion group.

One of methods in which polymerization is carried out using a polymerizable monomer containing an anion group is as follows. A polymerizable monomer containing an anion group is subjected to an oxidation polymerization or a radical polymerization under existence of an oxidizing agent and/or a polymerization catalyst in a solvent. Specifically, a predetermined amount of polymerizable monomer containing an anion group is dissolved in a solvent, and the mixture is kept at a constant temperature. To the mixture is added a solution which dissolved a predetermined amount of oxidizing agent and/or polymerization catalyst in a solvent beforehand. The mixture is made to react during a predetermined time. The polymer obtained by this reaction is adjusted to a fixed concentration by the solvent. In this production method, it is possible to carry out copolymerization of a polymerizable monomer containing no anion group with a polymerizable monomer containing an anion group. An oxidizing agent, an oxidation catalyst and a solvent used for polymerization of a polymerizable monomer containing an anion group are the same as used in polymerization of a precursor monomer to form a π conjugated conductive polymer. When the obtained polymer is a polyanion salt, it is preferable to modify it to a polyanion acid. As a method of modify to a polyanion acid, an ion exchange method using ion-exchange resin, dialysis and ultrafiltration are cited. Among them, ultrafiltration is preferable from the viewpoint of easy operation.

A commercially available conductive polymer can be also preferably used. Examples of a commercially available conductive polymer include: a conductive polymer composed of poly (3,4-ethylenedioxythiophene) and polystyrene sulfonic acid (PEDOT:PSS in Clevios™ series, made by H. C. Starck Co., Ltd.), PEDOT:PSS 483095 and 560596 (made by Aldrich Co., Ltd.), Denatron series (made by Nagase Chemtex Co., Ltd.). In addition, a polyanion is commercially available as ORMECON series made by Nissan Chemical Industries, Ltd.). In the present invention, these compounds can be also preferably used.

It may be used a water-soluble organic compound as a second dopant. A water-soluble organic compound which can be usable in the present invention is not particularly limited, and it can be selected from publicly known compounds. For example, an oxygen atom containing organic compound is preferably cited. As an oxygen atom containing organic compound, there is no specific limitation as long as it contains an oxygen atom in the molecule. Examples thereof are: a hydroxyl group containing compound, a carbonyl group containing compound, an ether group containing compound and a sulfoxide group containing compound. Examples of the aforesaid hydroxyl group containing compound include: ethylene glycol, diethylene glycol, propylene glycol, trimethylene glycol, 1,4-butanediol and glycerin. Among these, ethylene glycol and diethylene glycol are preferable. Examples of the aforesaid carbonyl group containing compound include: isophorone, propylene carbonate, cyclohexanone and γ butyrolactone. An example of the aforesaid ether group containing compound includes diethylene glycol monoethyl ether. An example of the aforesaid sulfoxide group containing compound includes dimethyl sulfoxide. Although these may be used solely and two or more compounds may be used together, it is preferable to use at least one compound chosen from dimethyl sulfoxide, ethylene glycol and diethylene glycol.

<Aqueous Solvent>

In the present invention, an aqueous solvent represents a solvent containing water in an amount of 50 weight % or more. It may be pure water without containing other solvent. As an ingredient other than water, although it is not particularly limited if it is a solvent which is compatible with water, an alcoholic solvent is preferably used. Among them, isopropyl alcohol, which has a boiling point near to that of water, is preferably used from the viewpoint of achieving smoothness of the formed film.

<Non-Conductive Polymer Containing a Hydroxyl Group>

A non-conductive polymer containing a hydroxyl group of the present invention is a copolymer composed of the following monomers M1, M2 and M3 as main copolymer components. Among the copolymer components, one of these monomers is contained in an amount of 50 mol % or more, or the total content of these monomers is 50 mol % or more. It is more preferable that the total content of these monomers is 80 mol % or more. Further, it may be a homopolymer made of one of these monomers. And it is one of preferable embodiments.

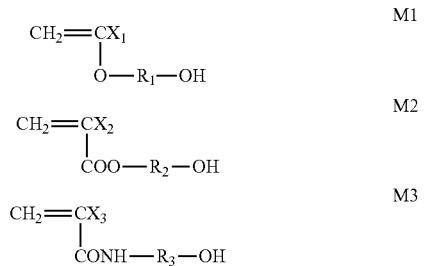

With respect to Polymer (A), although other monomer component may be copolymerized as long as it is soluble in an aqueous solvent, it is more preferable that the other monomer component has high water solubility. Moreover, as for Polymer (A), it is preferable that a content of an ingredient having a number average molecular weight of 1,000 or less is 0 to 5%. It can reduce more a behavior which decreases keeping stability of an element or exhibits a barrier of conductivity in perpendicular direction to the conductive layer by making a small content of low molecular weight ingredients.

As a method for achieving a content of an ingredient having a number average molecular weight of 1,000 or less to be 0 to 5%, the following can be used: a reprecipitation method, a preparative GPC and synthesis of a monodisperse polymer using a living polymerization, which can remove an ingredient having a low molecular weight or can reduce the production of an ingredient having a low molecular weight. A reprecipitation method is a method in which a polymer is dissolved in a solvent which can dissolve the polymer, then, the dissolved polymer is dropped in other solvent which poorly dissolves the polymer to result in precipitation of the polymer. Thus, an ingredient having a low molecular weight such as a monomer, a catalyst, or an oligomer is removed. Moreover, a preparative GPC can be done, for example, with a recycling preparative GPCLC-9100 (made by a Japanese Analytical Industry Co., Ltd.). By passing through a polystyrene gel column, a solution dissolving a polymer can be dividing by a molecular weight, and a desired low molecular weight ingredient can be removed. With a living polymerization method, it can keep the amount of the generation of a polymerization initiator constant over time and it can reduce a side reaction such as a termination reaction to result in a polymer having a uniform molecular weight. Since a molecular weight can be adjusted with an amount of added monomer, if a polymer having a molecular weight of 20,000 is synthesized, for example, generation of an ingredient of a low molecular weight can be controlled. From the viewpoint of production aptitude, a reprecipitation method and a living polymerization method are preferably employed.

A number average molecular weight of Polymer (A) of the present invention is preferably in the range of 3,000 and 2,000,000. More preferably, it is in the range of 4,000 and 500,000, and still more preferably, it is in the range of 5,000 and 100,000. A molecular weight distribution (defined as: (weight average molecular weight)/(number average molecular weight)) of Polymer (A) of the present invention is preferably 1.01 to 1.30, and more preferably, it is 1.01 to 1.25. A content of an ingredient having a number average molecular weight of 1,000 or less can be calculated as follows. In a distribution obtained by GPC, there is integrated an area of an ingredient having a number average molecular weight of 1,000 or less, and the integrated area is divided with a total area of the distribution. Although a solvent used in a living radical polymerization is not restricted in particular an long as it is inactive in the reaction conditions and it can dissolve a monomer and a produced polymer, preferable is a mixed solvent of an alcoholic solvent with water. Although the living radical polymerization temperature changes with initiators to be used, generally it is carried out at −10 to 250° C., and preferably, it is carried out at 0 to 200° C., and more preferably, it is carried out at 10 to 100° C.

<Composition of Organic Electronic Element>

A composition of an organic electronic element will be explained using FIG. 1.

On a transparent substrate 11, there are provided with a first electrode 14 and a second electrode 16 which are opposing with each other. And at least one organic functional layer 15 is provided between the first electrode 14 and the second electrode 16. In the present invention, the first electrode 14 contains a first conductive layer 12 composed of a metal or a metal oxide fine wire and a second conductive layer 13 composed of a conductive polymer, and the second conductive layer covers the first conductive layer.

As the organic functional layer 15 of the present invention, there can be cited without any limitation. For example, they include: an organic light emitting layer, an organic photoelectric conversion layer and a liquid crystal polymer layer without limitation. The present invention is especially effective when the organic functional layer is an organic light emitting layer or an organic photoelectric converting layer which is a thin layer and used as an element driven with an electric current.

<Organic Functional Layer Composition>

(Organic EL Element)

[Organic Light Emitting Layer]

In the present invention, an organic electronic element containing an organic light emitting layer may be further provided with layers which control the light emission in combination with the organic light emitting layer. They are layers such as: hole injection layer, hole transport layer, electron transport layer, electron injection layer, hole blocking layer, and electron blocking layer. Since the layer containing the conductive polymer of the present invention can be function as a hole injection layer, it may act as a hole injection layer, but it may be provided with an independent hole injection layer.

Although preferable structural examples are shown below, the present invention is not limited to these.
(i) (First electrode portion)/light emitting layer/electron transport layer/(second electrode portion)
(ii) (First electrode portion)/hole transport layer/light emitting layer/electron transport layer/(second electrode portion)
(iii) (First electrode portion)/hole transport layer/light emitting layer/hole blocking layer/electron transport layer/(second electrode portion)
(iv) (First electrode portion)/hole transport layer/light emitting layer/hole blocking layer/electron transport layer/cathode buffer layer/(second electrode portion)
(v) (First electrode portion)/anode buffer layer/hole transport layer/light emitting layer/hole blocking layer/electron transport layer/cathode buffer layer/(second electrode portion)

Here, the light emitting layer may be a single light emitting layer having an emission maximum wavelength in the range of 430-480 nm, 510-550 nm, or 600-640 nm. The light emitting layer may a white light emitting layer formed by laminating at least these three layers. Further, it may be provided with non-light emissive interlayer between the light emitting layers. It is preferable that the organic EL element of the present invention contains a white light emitting layer.

Examples of a light emitting material or a doping material used in an organic light emitting layer of the present invention include: anthracene, naphthalene, pyrene, a tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complex, tris(8-hydroxyquinolinate)aluminium complex, tris(4-methyl-8-quinolinate)aluminium complex, tris(5-phenyl-8-quinolinate)aluminium complex, aminoquinoline metal complex, benzoquinoline metal complex, tri-(p-terphenyl-4-yl)amine, 1-aryl-2,5-di(2-thienyl)prrole derivative, pyrane, quinacridone, rubrene, distilbene derivative, distyrylarylene derivative, fluorescent dye, rare earth metal complex and phosphorescence emitting material. However, the present invention is not limited to them. It is preferable that the light emitting material selected from theses compound is contained in an amount of 90 to 99.5 weight % and that the doping material is contained in an amount of 0.5 to 10 weight %. The organic light emitting layer is produced with conventionally known methods using the above-described compounds, and an evaporation deposition method, a coating method and a transfer method are cited as examples. The thickness of the organic light emitting layer is preferably from 0.5 to 500 nm, and it is more preferably from 0.5 to 200 nm.

[Second Electrode Portion]

The second electrode portion of the present invention becomes a cathode in an organic EL element. The second electrode portion of the present invention may be a single layer made of a conductive material. In addition to a conductive material, it may be combined with a resin to hold the conductive material. As a conductive material of second electrode portion, metal, alloy, a conductive compound and a mixture thereof, which have a small work function (4 eV or less), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injection metal with the second metal which is stable metal having a work function larger than electron injection metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. The sheet resistance as a cathode is preferably a few hundreds $\Omega/\square$ or less and the layer thickness is generally selected in the range of 10 nm to 5 µm and preferably in the range of 50 nm to 200 nm.

When a metal material is used as a conductive material for the second electrode portion, the light coming to the second electrode portion will be reflected and will return to the side of the first electrode portion. Although the metal nanowire in the first electrode portion will scatter or reflect a part of the light in the back direction, by using a metal material as a conductive material for the second electrode portion, this light becomes recyclable and the efficiency of extraction will be improved more.

<Organic Photoelectric Conversion Element>

An organic photoelectric conversion element has a laminated structure with: a first electrode portion, a photoelectric conversion layer containing a bulk heterojunction structure (p-type semiconductor and n-type semiconductor) and a second electrode portion.

It may be provided with an interlayer such as an electron transport layer between the photoelectric conversion layer and the second electrode portion.

The photoelectric conversion layer is a layer which converts light energy into electric energy, and it is composed of a bulk heterojunction layer uniformly mixed with a p-type semiconductor material and an n-type semiconductor material. A p-type semiconductor material functions relatively as an electron donor (donor), and an n-type semiconductor material functions relatively as an electron acceptor (acceptor). Here, an electron donor and an electron acceptor are "an electron donor and an electron acceptor which form a pair of electron and positive hole (charge separation state) by transfer of an electron from an electron donor to an electron acceptor when a light is absorbed." That is, an electron is not donated or received like an electrode, but an electron is donated or received by a photoreaction.

As a p-type semiconductor material, various types of condensed polycyclic aromatic compounds and conjugated system compounds are cited.

Examples of a condensed polycyclic aromatic compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene, a derivative thereof and a precursor thereof.

Examples of a conjugated system compound include: polythiophene and its oligomer, polypyrrole and its oligomer, poly aniline, polyphenylene and its oligomer, polyphenylene vinylene and its oligomer, poly thienylene vinylene and its oligomer, polyacethylene, polydiacetylene, a tetrathiafulvalene compound, a quinone compound, a cyano compound such as a tetracyanoquinodimethane, fullerene, a derivative thereof and a mixture thereof.

Among polythiophene and its oligomer, suitably used oligomers are thiophene hexamers such as: α-sexithionene, α,ω-dihexyl-α-sexithionene, α, ω-dihexyl-α-quinquethionene, and α,ω-bis(3-butoxypropyl)-α-sexithionene.

Examples of a polymer p-type semiconductor include: polyacetylene, polyparaphenylene, polypyrrole, polyparaphenylene sulfide, polythiophene, polyphenylene vinylene, polycarbazole, polyisothianaphthene, polyheptadiene, polyquinoline, and polyaniline. Further it can be cited as follows: substituted and non-substituted alternate copolymerized polythiophene disclosed in JP-A No. 2006-36755; polymer having a condensed thiophene structure disclosed in JP-A No. 2007-51289, JP-A No. 2005-76030, J. Amer. Chem. Soc., 2007, p. 4112, and J. Amer. Chem. Soc., 2007, p. 7246; thiophene copolymer disclosed in WO2008/000664, Adv. Mater., 2007, p. 4160, and Macromolecules, 2007, Vol. 40, p. 1981, Further, there can be used the following compounds: porphyrin, copper phthalocyanine; organic molecule complex such as tetrathiafulvalene (TTF)-tetracyanoquinodimethane (TCNQ) complex, bisethylenetetrathiafulvalene (BEDTTTF)-perchloric acid complex, BEDTTTF-Iodine complex, TCNQ-Iodine complex; fullerenes such as fullerene $C_{60}$, fullerene $C_{70}$, fullerene $C_{76}$, fullerene $C_{78}$, and fullerene $C_{84}$; carbon nanotube such as SWNT; dyes such as merocyanine dye and hemicyanine dye; σ conjugated polymers such as polysilane and polygerman, and organic-inorganic mixed materials disclosed in JP-A No. 2000-260999.

Among these π conjugated materials, preferable is a compound selected from the group consisting of condensed polycyclic aromatic compounds such as pentacene, fullerene compounds, condensed cyclic tetracarboxylic acid diimide compounds, metal phthalocyanine compounds and metal porphiline compounds. Here, pentacene is more preferable Examples of a pentacene compound are: pentacene compounds having a substituent disclosed in WO 03/16599, WO 03/28125, U.S. Pat. No. 6,690,029, and JP-A No. 2004-107216; pentacene precursors disclosed in US 2003/136964; substituted acenes and their derivatives disclosed in J. Amer. Chem. Soc., vol. 127. No. 14, 4986.

Among these compounds, preferable is a compound having a sufficiently high solubility to an organic solvent to be able to carry out a solution process, after dying, capable of forming a crystalline thin film and capable of achieving high mobility. Examples of such compounds are: acene compounds substituted with a trialkyl silyl ethynyl group described in J. Amer. Chem. Soc., vol. 123, p 9482 and J. Amer. Chem. Soc., vol. 130 (2008), No. 9, 2706; pentacene precursors disclosed in US 2003/136964; precursor type compounds (precursors) such as porphiline precursors disclosed in JP-A No. 2007-224019.

Among these, the latter precursor type compounds can be preferably used.

Precursor type compound becomes insoluble after being converted. As a result, when there are formed a positive hole transport layer, an electron transport layer, a positive hole block layer and an electron block layer, etc on a bulk heterojunction layer in a solution process, it will prevent dissolution of a bulk heterojunction layer. As a result, the materials which constitute the forgoing layers will not be mixed with the material which constitutes bulk heterojunction layer, and further improved efficiency and increased lifetime can be attained.

As a p-type semiconductor material, it is preferable to use a p-type semiconductor precursor which is converted to a p-type semiconductor material induced by a chemical structure change when exposed to heat, light, radiation or a vapor of a compound which triggers a chemical reaction. In particular, a compound which causes change in the chemical structure with heat is preferable.

Examples of an n-type semiconductor material include: fullerene, octaazaporphyrin, a perfluoro compound of a p-type semiconductor (perfluoropentacene and perfluorophthalocyanine), a polymer compound which contains an aromatic carboxylic acid anhydride and its imide in the structure, such as naphthalenetetracarboxylic anhydride, naphthalenetetracarboxylic diimide, pelylenetetracarboxylic anhydride, and perylenetetracarboxylic diimide.

Among them, a polymer containing a fullerene compound is preferable. Examples of a polymer containing a fullerene compound include a polymer having the following fullerene in the structure: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type). As a polymer containing a fullerene compound, it is preferable a polymer compound (derivative) having fullerene $C_{60}$ in the structure.

A polymer containing fullerene is roughly divided into the following: a polymer in which fullerene is bonded as a pendant to the polymer main chain; and a polymer in which fullerene is contained in the polymer main chain. It is preferable a polymer in which fullerene is contained in the polymer main chain.

It is presumed that since a polymer having a pendant fullerene has a branched polymer structure, it is hard to achieve a high density packing when it is solidified, and as a result, it is difficult to obtain high mobility.

As a forming method of a bulk heterojunction layer containing an electron acceptor and an electron donor mixed each other, it can be cited a vapor deposition method and a coating method (including a cast method and a spin coat method).

When a photoelectron conversion element of the present invention is employed for a photoelectron conversion material such as a solar cell, the photoelectron conversion element may be used as a single layer, and it may be used by laminating (to form a tandem type).

In order to avoid deterioration by oxygen and water in the atmosphere, the photoelectron conversion material is preferably sealed with a known method.

EXAMPLES

Hereafter, the present invention will be described specifically by referring to examples, however, the present invention is not limited to them. In Examples, the term "%" is used. Unless particularly mentioned, this represents "mass %".

Synthetic Example

Living Radical Polymerization Method Using ATRP (Atom Transfer Radical Polymerization) Method (Synthesis of Initiator 1)

Synthetic Example 1

Synthesis of Methoxy Capped Oligo(Ethylene Glycol) Methacrylate

In a 50 ml three necked flask were placed 7.3 g (35 mmol) of 2-bromoisobutyryl bromide, 2.48 g (35 mmol) of triethylamine and 20 ml of THF. The inner temperature of the solution was kept to be 0° C. with an ice bath. Into the solution was dropwise added 10 g (23 mmol) of oligo(ethylene glycol) (the number of ethylene glycol being 7 to 8, made by Laporte Specialties Co., Ltd.) as 33% of THF solution in an amount of 30 ml. After stirring the solution for 30 minutes, the temperature of the solution was raised to room temperature, and further the solution was stirred for 4 hours. THF was removed under reduced pressure with a rotary evaporator. The residue was dissolved in ethyl ether and transferred into a separation funnel. Water was added in the separation funnel to wash the ether layer. After repeating this process 3 times, the ether layer was dried with $MgSO_4$. Ether was removed under reduced pressure with a rotary evaporator to obtain 8.2 g (yield: 73%) of Initiator 1. (Synthesis of Non-conductive polymer containing a hydroxyl group via living polymerization method (ATRP))

Synthetic Example 2

Synthesis of poly(2-hydroxyethyl methacrylate)

Into a Schlenk flask were placed 500 mg (1.02 mmol) of Initiator 1, 4.64 g (40 mmol) of 2-hydroxyethyl methacrylate (made by Tokyo Kasei Co., Ltd.) and 5 ml of a water-methanol mixed solvent (50:50 (v/v %)). The Schlenk flask was immersed in liquid nitrogen under a reduced pressure for 10 minutes. The Schlenk flask was taken out from liquid nitrogen. After 5 minutes, nitrogen gas substitution was carried out. This operation was repeated three times. Then, 400 mg (2.56 mmol) of bipyridine and 147 mg (1.02 mmol) of CuBr were added into the Schlenk flask under nitrogen and stirred at 20° C. After 30 minutes, the reaction solution was dropped on a Kiriyama Rohto (diameter of 4 cm) provided with a filter paper and silica and the reaction solution was recovered. The solvent was removed under a reduced pressure with a rotary evaporator. The residue was dried under a reduced pressure at 50° C. for 3 hours to yield 2.60 g (yield: 84%) of Non-conductive polymer containing a hydroxyl group (P-1). The produced polymer P-1 exhibited the number average molecular weight of 13,100, molecular weight distribution of 1.17, and the content of the components of a molecular weight of less than 1,000 was 0 weight %. The structure and molecular weight of the polymer were respectively measured with H-NMR (400 MHz, made by JEOL Ltd.) and GPC (Waters 2695, made by Waters Co., Ltd.).
<GPC Measurement Conditions>
  Apparatus: Wagers 2695 (Separations Module)
  Detector: Waters 2414 (Refractive Index Detector)
  Column: Shodex Asahipak GF-7M HQ
  Eluant: Dimethylformamide (20 mM LiBr)
  Flow rate: 1.0 ml/min
  Temperature: 40° C.

In the same manner as described above, the following homopolymer of non-conductive polymer containing a hydroxyl group were prepared: poly(hydroxybutyl acrylate) (P-2); poly(hydroxyethyl vinyl ether) (P-3); poly(hydroxyethyl acrylamide) (P.4) (number average molecular weight of about 20,000; and content of the components of a molecular weight of less than 1,000 was 0 weight %). In addition, it was prepared a copolymer P-5 from hydroxyethyl acrylate (60 mol %) and methyl acrylate (40 mmol %).
<Preparation of Silver Nanowires>
As metal particles, there were prepared silver nanowires having an average minor axis of 75 nm and an average length of 35 μm using poly(vinyl pyrrolidone) K30 (molecular weight of 50,000, made by ISP Co., Ltd.) with reference to the method described in Adv. Mater., 2002, 14, 833-837. The prepared silver nanowires were filtered using a ultrafiltration membrane followed by washing with water. Then, the silver nanowires were re-dispersed in an aqueous solution of hydroxypropyl methyl cellulose 60SH-50 (made by Shin-Etsu Chemical Co., Ltd), wherein it was added in an amount of 25 weight % with respect to silver. Thus a silver nanowire dispersion liquid was prepared.
<Preparation of First Conductive Layer>
A PET film (A4100, made by TOYOBO Co., Ltd) was used as a transparent substrate, and a silver nano ink (MDot-SLP, made by Mitsuboshi. Belting Ltd.) was used. A silver fine wire pattern was prepared by carrying out gravure printing with a gravure plating having: a fine wire width of 300 μm; a fine wire depth of 50 μm; and a line interval of 2,000 μm.

First conductive layers of Electrodes 1-9 and 13-30 were prepared with gravure printing by changing the density of the ink, the viscosity of the ink, and the shape of the gravure plate (fine wire width, fine wire depth, line interval, and cross-sectional shape).

Electrodes 10-12 were prepared by printing with a silver ink using an applicator followed by carrying out etching. In Table 1, there are shown: wire width, height, coefficient of cross-sectional shape, and line interval of the prepared first conductive layer.
<Preparation of Second Conductive Layer>
On a substrate having been performed patterning was coated a layer of a conductive polymer, or a mixed liquid of a conductive polymer and a non-conductive polymer (1:1) as described in Table 1 using a spin coater.
(Conductive Polymer)
  PH510: PEDOT-PSS dispersion liquid (PH510 (solid content, 1.89%), made by H. C. Starck Co., Ltd.)
  P4083: PEDOT-PSS dispersion liquid (Clevios P AI 4083 (solid content, 1.5%), made by H. C. Starck Co., Ltd.)
(Non-Conductive Polymer Containing a Hydroxyl Group)
  CMC: carboxymethyl cellulose, low viscosity type (made by Sigma-Aldrich Co., Ltd.)
  PVA: polyvinyl alcohol PVA-235 (Kuraray Co., Ltd)
  P-1: poly(hydroxyethyl acrylate) (Synthetic Example 2)
  P-2: poly(hydroxybutyl acrylate) (Synthetic Example 2)
  P-3: poly(hydroxyethyl vinyl ether) (Synthetic Example 2)
  P-4: poly(hydroxyethyl acrylamide) (Synthetic Example 2)
  P-5: copolymer of hydroxyethyl acrylate (60 mol %) and methyl acrylate (40 mol %)

Synthetic Example 2

The thickness of second conductive layer of Electrodes 1-30 and the used conductive polymers and non-conductive polymers are shown in Table 1. Electrodes 16, 20, 21, 24, 26 and 28 was provided with a third conductive layer which was prepared on a PET film with a silver nanowire dispersion liquid coated with a spin coater so that the coating amount of silver nanowires became 0.06 g/m² followed by drying. Then a first and a second conductive layer were formed thereon.

The shape evaluation of the first conductive layer was done using a laser microscope. The height, the width and the cross-sectional shape of the fine wire were measured and they were evaluated as an average value of 20 points.

There were evaluated conductivity and transparency of the first conductive layer, and the second conductive layer and the portion which was laminated with the third conductive layer according to the following.
(Transparency)
Total light transmissivity was measured using HAZE METER NDH 5000 (made by Tokyo Denshoku Co., Ltd.).

Evaluation of transparency was made using the following criteria. It is preferable to be 70% or more by considering a loss of light in an element.
- 5: 80% or more
- 4: 70% or more to less than 80%
- 3: 60% or more to less than 70%
- 2: 50% or more to less than 60%
- 1: 0% or more to less than 50%

(Conductivity)

Surface resistivity was measured using a resistivity meter (Loresta GP Model MCP-T610, made by Mitsubishi Chemical Analytech, Co., Ltd.). Evaluation of Conductivity was made using the following criteria. Rank 4 or more is preferable, and rank 5 is more preferable.
- 5: less than $10^3 \Omega/\square$
- 4: $10^3 \Omega/\square$ or more to less than $10^4 \Omega/\square$
- 3: $10^4 \Omega/\square$ or more to less than $10^5 \Omega/\square$
- 2: $10^5 \Omega/\square$ or more to less than $10^6 \Omega/\square$
- 1: more than $10^6 \Omega/\square$ (Preparation of Organic EL Element)

<Formation of Taking Out Electrode>

A PET substrate of 60 mm×80 mm×0.1 mm provided with gas barrier layers on both surfaces thereof was vapor deposited with ITO with an average layer thickness of 150 nm. After subjecting to pattering of FIG. 5 (5a), this substrate was subjected to an ultrasonic cleaning treatment while immersing in 2-propanol using an ultrasonic cleaner BRANSONIC 3510 J-MT (made by Emerson Japan, Ltd.) for 10 minutes <Formation of First Conductive Layer>

Figure 5:
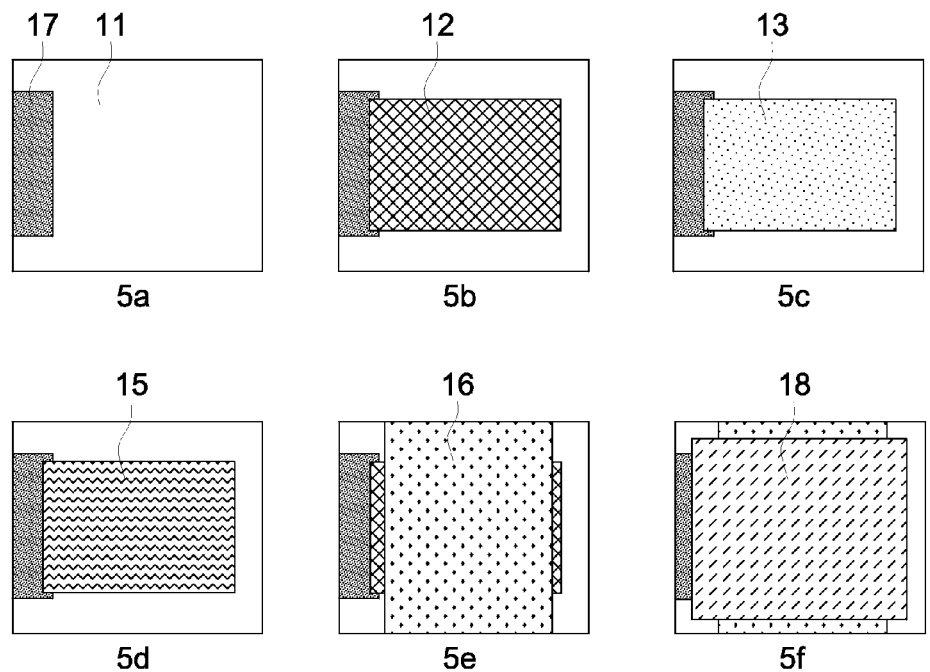
FIG. 5 is a drawing which shows a production method of an organic electronic element of the present invention.
Figure 6:
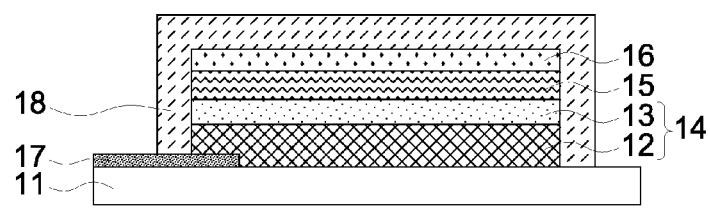
FIG. 6 is a drawing which shows a composition of an organic EL element of the present invention.

On the substrate having been treated with ultrasonic cleaning was pattern-printed in a lattice form in the region of FIG. 5 (5b) with a silver nano ink (MDot-SLP, made by Mitsuboshi Belting Ltd.) using a gravure printing machine (K303 multi-coater, made by RK Print Coat Instruments Ltd.). Then, it was subjected to drying and heating at 80° C. for 1 minute and 130° C. for 15 minutes to form a first conductive layer.

<Formation of Second Conductive Layer>

On the substrate having been formed with a first conductive layer was solid coated in the region of FIG. 5 (5c) with PEDOT:PSS CLEVIOS P AI 4083 (solid content 1.5%) (made by H. C. Starck, Co., Ltd.) using a gravure printing machine (K303). Then, it was subjected to drying and heating at 80° C. for 1 minute and 130° C. for 15 minutes to form a second conductive layer.

<Formation of Organic Functional Layer>

A hole transport layer and layers thereafter were formed with a vapor deposition method. In each of the vapor deposition crucibles in a commercially available vacuum deposition apparatus was loaded with a constituting material of each layer with an appropriate amount for preparing each element. The used vapor deposition crucibles were prepared with a resistant heating material made of molybdenum or tungsten.

<Formation of Hole Transport Layer>

After reducing the pressure of the vacuum tank to $1 \times 10^{-4}$ Pa, the vapor deposition crucible loaded with Compound 1 was heated via application of electric current and deposition was carried out in the region of FIG. 5 (5d) on the first electrode at a deposition rate of 0.1 nm/second. Thus, it was produced a hole transport layer having a thickness of 30 nm.

<Formation of Light Emitting Layer>

Each light emitting layer was formed according to the following steps.

On the produced hole transport layer were co-vapor deposited with Compound 2, Compound 3 and Compound 5 in the region of FIG. 5 (5d) at a deposition rate of 0.1 nm/second to achieve the density of Compound 2 to be 13 mass % and the density of Compound 3 to be 3.7 mass %. Thus, it was produced a green-red phosphorescent light emitting layer having a thickness of 10 nm with a maximum emitting wavelength of 622 nm.

Subsequently, Compound 4 and Compound 5 were co-vapor deposited in the region of FIG. 5 (5d) at a deposition rate of 0.1 nm/second to achieve the Compound 4 to be 10 mass %. Thus, it was produced a blue phosphorescent light emitting layer having a thickness of 15 nm with a maximum emitting wavelength of 471 nm.

<Formation of Hole Blocking Layer>

Further, Compound 6 was vapor deposited in a thickness of 5 nm on the formed light emitting layer in the region of FIG. 5 (5d) to form a hole blocking layer.

<Formation of Electron Transport Layer>

Subsequently, CsF was co-vapor deposited with Compound 6 on the formed hole blocking layer in the region of FIG. 5 (5d) to form an electron transport layer having a thickness of 45 nm with the thickness ratio of CsF becoming to 10%.

[Formation of Second Electrode]

<Formation of Cathode Electrode>

Al was vapor deposited under a reduced pressure of $5 \times 1.0^{-4}$ Pa on the formed electron transport layer in the region of FIG. 5 (5e) to form a cathode electrode having a thickness of 100 nm.

<Formation of Sealing Layer>

On the form electron transport layer was used a flexible sealing member composed of a polyethylene terephthalate substrate vapor deposited thereon $Al_2O_3$ having a thickness of 300 nm. An adhesive agent was coated on the flexible sealing member and it was pasted in the region of FIG. 5 (54 followed by subjecting to thermal treatment to cure the adhesive agent to result in sealing. ITO and Al which were located outside of the sealing member each were respectively used as an anode electrode and a cathode electrode. Thus, Organic EL element-1 was prepared.

Organic EL element-2 to Organic EL element-30 were prepared in the same manner as preparation of Organic EL element-1 except that a first conductive layer, a second conductive layer and a third conductive layer were changed as described in Table 1.

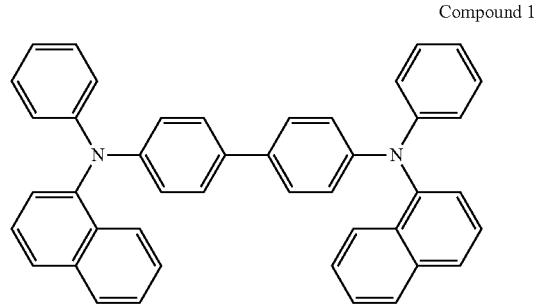

Compound 1

-continued

Compound 2

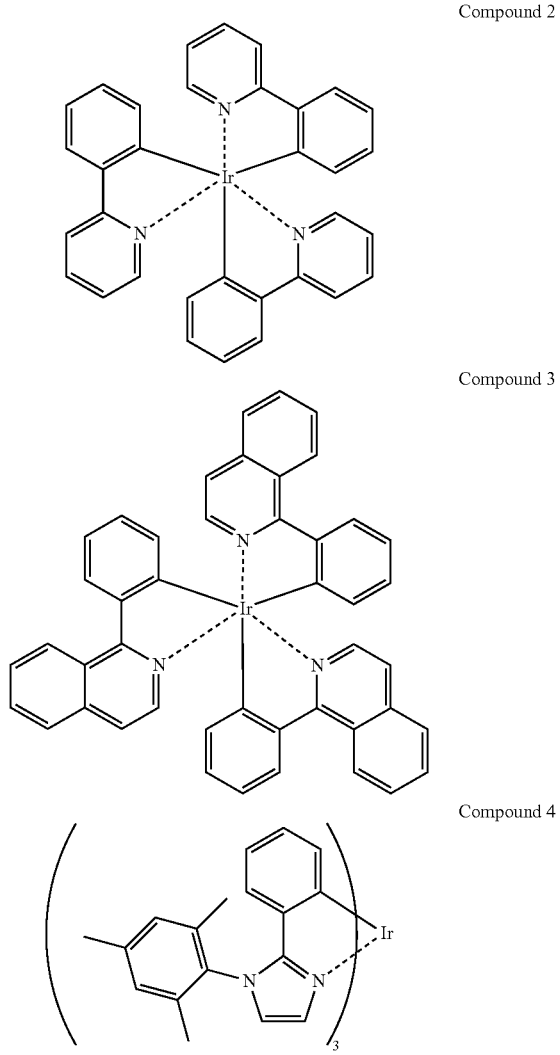

Compound 3

Compound 4

-continued

Compound 5

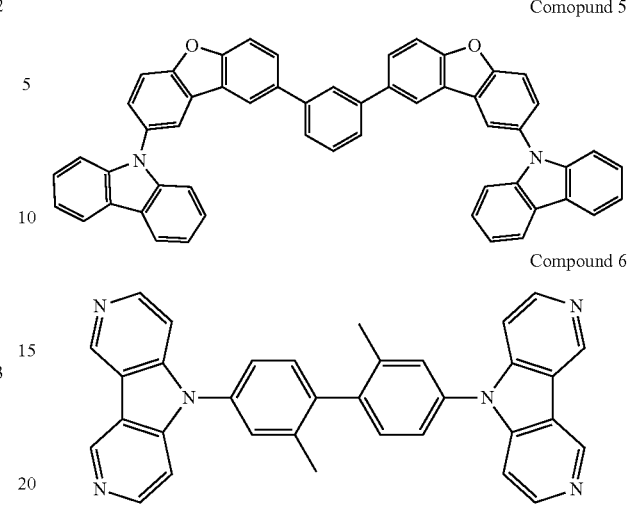

Compound 6

(Evaluation of EL Element)

The prepared each EL element was allowed to emit light at 1,000 cd/m² by applying a direct current using Source Major Unit 2400 made by Keithley Instrument Inc.

Five pieces of substrates each were produced. One substrate has 2 light emitting portions. The evaluation was done with respect to 10 light emitting portions in total.

(Driving Voltage)

An average value for the light emitted elements was determined as a driving voltage for each element. The ratio of driving voltage to that of Organic EL element-3 was calculated. The evaluation was made according to the following indexes. Preferable is Index 3 or more. More preferable is Index 4 or more.

5: less than 80%
4: 80% or more to less than 90%
3: 90% or more to less than 110%
2: 110% or more to less than 130%
1: 130% or more, or does not emit light

TABLE 1

| Electrode No. | First conductive layer | | | | Line interval (μm) | Second conductive layer | | | Third conductive layer | Evaluation of Electrode | | Organic EL element No. | Evaluation of Element Driving voltage | Remarks |
|---|---|---|---|---|---|---|---|---|---|---|---|---|---|---|
| | Line width (μm) | Height (μm) | Aspect ratio | *1 | | Thickness (μm) | Conductive polymer | *2 | | Transparency | Conductivity | | | |
| 1 | 480 | 5.2 | 0.011 | 0.83 | 2000 | 500 | PH510 | — | — | 1 | 3 | 1 | 1 | Comp. |
| 2 | 320 | 2.2 | 0.007 | 0.85 | 2000 | 500 | PH510 | — | — | 2 | 3 | 2 | 1 | Comp. |
| 3 | 310 | 0.6 | 0.002 | 0.98 | 2000 | 300 | PH510 | — | — | 2 | 3 | 3 | 3 | Comp. |
| 4 | 160 | 3.2 | 0.020 | 0.85 | 1000 | 400 | PH510 | — | — | 2 | 3 | 4 | 1 | Comp. |
| 5 | 130 | 5.8 | 0.045 | 0.83 | 1000 | 500 | PH510 | — | — | 1 | 3 | 5 | 1 | Comp. |
| 6 | 90 | 2.8 | 0.031 | 0.79 | 500 | 300 | PH510 | — | — | 1 | 4 | 6 | 1 | Comp. |
| 7 | 65 | 8.2 | 0.126 | 0.75 | 500 | 300 | PH510 | — | — | 2 | 4 | 7 | 1 | Comp. |
| 8 | 35 | 4.3 | 0.123 | 0.82 | 200 | 300 | P4083 | — | — | 2 | 4 | 8 | 1 | Comp. |
| 9 | 15 | 2.8 | 0.187 | 0.73 | 200 | 400 | P4083 | — | — | 2 | 4 | 9 | 1 | Comp. |
| 10 | 105 | 0.18 | 0.002 | 0.98 | 1000 | 300 | P4083 | — | — | 2 | 3 | 10 | 3 | Comp. |
| 11 | 60 | 0.1 | 0.002 | 0.95 | 500 | 300 | P4083 | — | — | 2 | 4 | 11 | 3 | Comp. |
| 12 | 25 | 0.12 | 0.005 | 0.97 | 200 | 300 | P4083 | — | — | 2 | 5 | 12 | 3 | Comp. |
| 13 | 180 | 1.7 | 0.009 | 0.87 | 2000 | 500 | P4083 | P-1 | — | 5 | 5 | 13 | 5 | Inv. |
| 14 | 175 | 1.0 | 0.006 | 0.85 | 2000 | 400 | P4083 | P-1 | — | 4 | 5 | 14 | 5 | Inv. |
| 15 | 180 | 0.4 | 0.002 | 0.70 | 2000 | 300 | P4083 | — | — | 4 | 4 | 15 | 4 | Inv. |
| 16 | 145 | 1.7 | 0.012 | 0.86 | 1500 | 500 | P4083 | — | AgNW | 4 | 5 | 16 | 5 | Inv. |
| 17 | 130 | 1.3 | 0.010 | 0.85 | 2000 | 400 | PH510 | P-1 | — | 5 | 5 | 17 | 5 | Inv. |
| 18 | 115 | 1.0 | 0.009 | 0.68 | 2000 | 300 | P4083 | P-2 | — | 5 | 5 | 18 | 5 | Inv. |
| 19 | 120 | 0.7 | 0.006 | 0.75 | 2000 | 300 | P4083 | P-3 | — | 5 | 5 | 19 | 5 | Inv. |

TABLE 1-continued

| Electrode No. | First conductive layer | | | | | Second conductive layer | | Third conductive layer | Evaluation of Electrode | | Organic EL element No. | Evaluation of Element Driving voltage | Remarks |
|---|---|---|---|---|---|---|---|---|---|---|---|---|---|
| | Line width (μm) | Height (μm) | Aspect ratio | *1 | Line interval (μm) | Thickness (μm) | Conductive polymer | *2 | | Transparency | Conductivity | | | |
| 20 | 75 | 1.3 | 0.017 | 0.82 | 1500 | 400 | P4083 | P-4 | AgNW | 5 | 5 | 20 | 5 | Inv. |
| 21 | 75 | 0.6 | 0.008 | 0.76 | 1500 | 300 | P4083 | P-5 | AgNW | 5 | 5 | 21 | 5 | Inv. |
| 22 | 55 | 1.0 | 0.018 | 0.77 | 1000 | 300 | P4083 | P-1 | — | 5 | 5 | 22 | 5 | Inv. |
| 23 | 55 | 0.6 | 0.011 | 0.72 | 1000 | 300 | PH510 | P-2 | — | 5 | 5 | 23 | 5 | Inv. |
| 24 | 100 | 1.8 | 0.018 | 0.82 | 1000 | 500 | P4083 | P-3 | AgNW | 5 | 5 | 24 | 5 | Inv. |
| 25 | 55 | 1.8 | 0.033 | 0.83 | 1000 | 500 | PH510 | P-4 | — | 5 | 5 | 25 | 4 | Inv. |
| 26 | 25 | 1.7 | 0.068 | 0.80 | 500 | 500 | P4083 | P-5 | AgNW | 5 | 5 | 26 | 5 | Inv. |
| 27 | 75 | 0.3 | 0.004 | 0.62 | 1500 | 300 | P4083 | — | — | 4 | 4 | 27 | 4 | Inv. |
| 28 | 35 | 0.4 | 0.011 | 0.85 | 1000 | 300 | PH510 | — | AgNW | 4 | 5 | 28 | 5 | Inv. |
| 29 | 25 | 0.3 | 0.012 | 0.65 | 1000 | 300 | P4083 | P-1 | — | 5 | 5 | 29 | 5 | Inv. |
| 30 | 20 | 0.9 | 0.045 | 0.75 | 500 | 400 | P4083 | P-4 | — | 5 | 5 | 30 | 5 | Inv. |

Inv.: Present invention,
Comp.: Comparison,
*1: Cross-sectional shape coefficient,
*2: Non-conductive polymer It is found that the electrode of the present invention has high transparency and excellent conductivity. Further, it is found that Organic EL element using an electrode of the present invention can reduce a driving voltage and is excellent in energy efficiency brought by high transparency and high conductivity of the electrode.

DESCRIPTION OF SYMBOLS

10: Organic electric element
11: Transparent substrate
12: First conductive layer
13: Second conductive layer
14: First electrode
15: Organic functional layer
16: Second electrode auxiliary electrode
17: Taking out electrode
18: Sealing member

The invention claimed is:

1. A transparent electrode comprising: a first conductive layer composed of a metal or a metal oxide fine wire which is formed in a pattern on a substrate directly; and a second conductive layer which covers the first conductive layer and contains a conductive polymer,
wherein the fine wire in the first conductive layer satisfies the following conditions,
Line width (W): 20 to 200 μm;
Height (H): 0.2 to 2.0 μm;
Aspect ratio: $0.001 < H/W \leq 0.1$; and
Cross-sectional shape coefficient: $0.6 < S/(W \cdot H) < 0.9$,
provided that "S" represents a cross-sectional area of the conductive layer.

2. The transparent electrode described in claim 1, wherein the Height of the pattern of the first conductive layer is 0.5 to 1.5 μm.

3. The transparent electrode described in claim 1, wherein the first conductive layer is composed of silver particles.

4. The transparent electrode described in claim 1, wherein the second conductive layer contains the following Polymer (A),

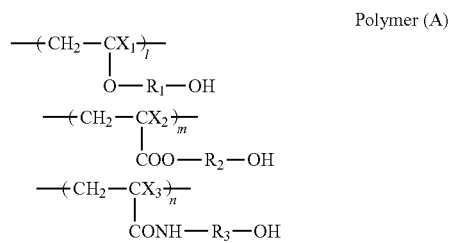

Polymer (A)

wherein, $X_1$ to $X_3$ each independently represent a hydrogen atom or a methyl group, $R_1$ to $R_3$ each independently represent an alkylene group having carbon atoms of 5 or less, "l", "m" and "n" each represent a composition ratio in mol %, with the condition of: $50 \leq l+m+n \leq 100$.

5. An organic electronic element having the transparent electrode described in claim 1.

6. The organic electronic element described in claim 5 being used for an organic electroluminescence element or an organic solar cell.

7. The transparent electrode described in claim 1, wherein the first conductive layer is formed by a coating method.

8. The transparent electrode described in claim 1, wherein the first conductive layer is formed before forming the second conductive layer.

9. The transparent electrode described in claim 1, wherein the first conductive layer is formed by a coating method before forming the second conductive layer.

* * * * *